United States Patent
Elms

(10) Patent No.: US 6,765,390 B2
(45) Date of Patent: Jul. 20, 2004

(54) DIAGNOSTIC WIRING VERIFICATION TESTER

(75) Inventor: Robert Tracy Elms, Monroeville, PA (US)

(73) Assignee: Eaton Corporation, Cleveland, OH (US)

(*) Notice: Subject to any disclaimer, the term of this patent is extended or adjusted under 35 U.S.C. 154(b) by 210 days.

(21) Appl. No.: 10/071,619

(22) Filed: Feb. 8, 2002

(65) Prior Publication Data

US 2003/0151413 A1 Aug. 14, 2003

(51) Int. Cl.[7] .......................... G01R 31/14; H04B 3/46
(52) U.S. Cl. ...................... 324/541; 324/509; 324/551; 361/50
(58) Field of Search ................................ 324/541, 536, 324/508, 509, 551, 510, 522, 523; 361/45–47, 50, 42; 340/650–652; 702/58

(56) References Cited

U.S. PATENT DOCUMENTS

| | | | |
|---|---|---|---|
| 5,224,006 A | 6/1993 | MacKenzie et al. | 361/45 |
| 5,345,180 A * | 9/1994 | Maier et al. | 324/537 |
| 5,448,491 A * | 9/1995 | Janke et al. | 702/58 |
| 5,459,630 A | 10/1995 | MacKenzie et al. | 361/45 |
| 5,514,964 A * | 5/1996 | Benesh et al. | 324/509 |
| 5,691,869 A | 11/1997 | Engel et al. | 361/42 |
| 5,712,572 A * | 1/1998 | Tamechika et al. | 324/551 |
| 6,072,317 A | 6/2000 | MacKenzie | 324/536 |

* cited by examiner

Primary Examiner—Anjan K. Deb
(74) Attorney, Agent, or Firm—M. J. Moran

(57) ABSTRACT

A tester for verifying the integrity of insulation in a branch circuit of a power distribution system. Two test circuits are included; the first providing an insulation test; and a second, a shared/grounded neutral test. In the insulation test, a 500-volt ac output limited to 5 milliamps is selectively applied to the pairs of wires of the branch circuit. If an output current of greater than 3 milliamps is recorded, an insulation failure is noted and the operator proceeds to the second test which applies a pulsed 3 volt, 1 ampere current-limited voltage across the suspected leads. One of the suspected leads is monitored with a portable ammeter to detect any pulse current.

9 Claims, 1 Drawing Sheet

DIAGNOSTIC WIRING VERIFICATION TESTER

BACKGROUND OF THE INVENTION

1. Field of the Invention

This invention relates to testing of electrical distribution circuits, and particularly to a tester that will verify the existence of wiring problems such as an insulation failure or grounded/shared neutrals.

2. Related Art

The common type of circuit breaker used for residential, commercial and light industrial applications has an electro-mechanical thermal magnetic trip device to provide an instantaneous trip in response to a short circuit and a delayed trip in response to persistent overcurrent conditions. Some circuit breakers of this type include ground fault protection, which trips the circuit breaker in response to a line-to-ground fault and, in some cases, a neutral-to-ground fault. Ground fault protection is provided by an electronic circuit which is set to trip at about 4 to 6 milliamps of ground fault current for people protection, and at about 30 milliamps for equipment protection. It is known to incorporate a test circuit in the circuit breaker, which tests at least portions of the electronic ground fault test circuit. It is also known to test for proper wiring connections. Test circuits for this purpose are commercially available. One such circuit is described in U.S. Pat. No. 6,072,317, assigned to the assignee of this application.

More recently, interest has arisen in providing protection against arc faults. Arc faults are intermittent, high impedance faults which can be caused, for instance, by worn insulation, loose connections, broken conductors and the like. Arc faults can occur in the permanent wiring, at a receptacle or, more likely, in the wiring of loads or extension cords plugged into the receptacle. Because of their intermittent and high impedance nature, they do not generate currents of sufficient instantaneous magnitude or sufficient average current to trigger the thermal-magnet trip device which provides the short circuit and overcurrent protection within a circuit breaker.

Arc fault detectors are generally of two types. One type responds to the random high frequency content of the current waveform generated by an arc. The other basic type of arc fault detector responds to the step increase in current occurring as the arc is repetitively and randomly struck. Examples of arc fault detectors of the latter type are disclosed in U.S. Pat. Nos. 5,224,006 and 5,691,869. Built in test circuits have also been proposed for such arc fault detectors. U.S. Pat. No. 5,459,630 discloses several forms of built in test circuits for such arc fault detectors. In one embodiment, in which the arc fault detector utilizes a coil to sense current, the test circuit adds a capacitor which forms, with the impedance of the coil, an oscillator generating wave form with an amplitude which simulates the rapid rise of a step change in current produced by an arc. In another embodiment, the user must repetitively close a switch, which connects a resistor between the line conductor and neutral to again generate large amplitude pulses.

While arc fault and ground fault circuit breakers will trip on ground or arcing fault conditions, they do not necessarily indicate where the fault is in a real installation. One difficulty is that the circuit breaker containing the detectors is located at a load center together with the circuit breakers for other circuits in the installation. However, the fault condition can occur anywhere downstream. Also, there may be some loads that cause nuisance tripping when a fault current does not exist.

There is a need, therefore, for improved test circuits for electrical distribution systems that can verify the integrity of branch wiring.

There is also a need for verifying the proper operation of an arc fault or ground fault circuit that has responded to a fault current condition, especially faults which are remote from the detectors, to assure the problem is within the circuit and not within the detector. Additionally, there is a further need for such a testing circuit that will assist in identifying the location of the fault. Furthermore, there is need for such testers which are flexible, simple and economical.

SUMMARY OF THE INVENTION

These needs and others are satisfied by this invention, which is directed to a tester that has two modes of operation, an insulation failure test mode and a shared/grounded neutral test mode. In the insulation failure test mode, a relatively large AC voltage source supplying a relatively small current, in the order of approximately 3 to 5 milliamps, is selectively applied to a pair of wires in the circuit under test. The magnitude of the voltage source that is applied is substantially greater than the line voltage normally applied to the circuit, but less than the voltage rating of the wiring insulation. A current meter monitors the leakage current flowing in the test circuit. If the leakage current is greater than approximately 3 milliamps, then an insulation failure exists.

In the shared/grounded neutral test mode, a pulsed low voltage source is applied across the ground and neutral conductors of the circuit under test. A portable ammeter then monitors any current flowing through either the neutral or ground conductors, starting at a location relatively near the voltage source, to detect the flow of a pulse current. If a pulse current is detected, the portable ammeter is moved along the conductor in a direction away from the source. The point at which the pulse current vanishes will identify the location of the fault. Both tests are conducted with the main power to the circuit and any load disconnected.

BRIEF DESCRIPTION OF THE DRAWINGS

A full understanding of the invention can be gained from the following description of the preferred embodiments when read in conjunction with the accompanying drawing in which.

DESCRIPTION OF THE PREFERRED EMBODIMENT

Figure 1:
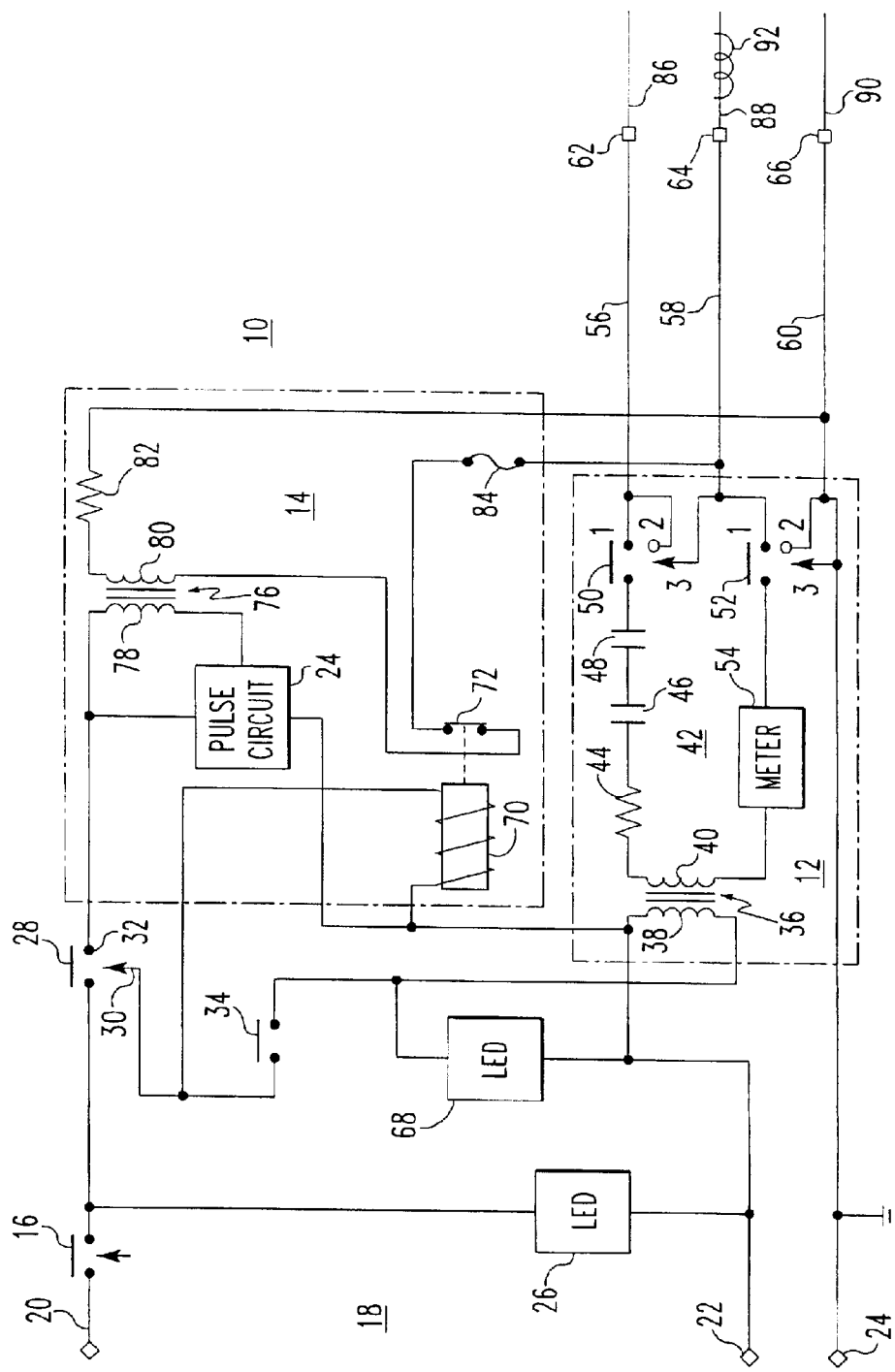
FIG. 1 is a circuit diagram of a preferred embodiment of the tester of this invention.

The tester 10 of this invention illustrated in FIG. 1 is intended to be applied to a branch circuit of an electrical power distribution system, having a line conductor 86, a neutral conductor 88 and ground conductor 90. Typically, the branch circuit is protected by a circuit breaker mounted in a load center that provides overcurrent protection. The load center normally houses additional circuit breakers providing protection for additional branch circuits. The neutral conductor 88 and the ground conductor 90 are connected to earth-ground on the utility side of the load center. Typically, the load center is located in a basement or utility room and the branch circuit extends through the walls of the structure to provide electric power to a portion of the structure. The tester of this invention is intended to verify the integrity of the insulation electrically isolating the conductors 86, 88 and 90 from each other, so that degraded insulation can be identified.

The tester of this invention is referred to generally by reference character 10. The test circuit 10 is connected to the line 20, neutral 22 and ground 24 terminals of the power source 18. The line branch 20 of the tester 10 is connected serially through an on/off switch 16. A light emitting diode is connected between the line 20 and neutral conductor 22 just downstream of the on/off switch 16 to provide an indication when the tester is switched to the "on" position by closing the switch 16. Preferably, the light emitting diode 26, which serves this purpose, is green to conform to normal conventions. The load side of the tester 10 is connected through line, neutral and ground leads, respectively, 56, 58 and 60, which preferably are correspondingly color-coded black, white and green. The line neutral and ground leads respectfully terminate in terminals 62, 64 and 66 which are connected to the corresponding line, neutral and ground conductors 86, 88 and 90 of the branch circuit.

The tester 10 basically comprises two separate testing circuits 12 and 14 to respectively provide an insulation test and a shared/grounded neutral test. Mode switch 28 connects the line wire 20 to either the insulation test circuit at terminal 30 or the shared/grounded neutral test circuit at terminal 32. When the mode switch 28 is connected to terminal 30, the primary winding 38 of the step-up transformer 36 is connected between the line and neutral connectors 20 and 22 respectively through the test button switch 34, which is in a normally open position. A light emitting diode 68 is connected in parallel with the primary winding 38 on the neutral side of the test switch 34 so that when the test switch is closed, the light emitting diode 68 turns on and indicates that the testing circuit 12 is energized. Preferably, the light emitting diode 68 is a color different than the light emitting diode 26, for example, red. The primary/secondary winding ratio of the step-up transformer 36 is chosen to desirably provide a substantially higher voltage on the secondary side 40 that is below the voltage rating of the branch circuit wiring 86, 88 and 90. Home wiring is normally rated for 600 volts ac. In this preferred embodiment, for a normal 120-volt household source 18, the secondary is designed to provide an output voltage of approximately 500 volts. The output of the secondary side 40 of the step-up transformer 36 is connected through a series arrangement of a 0 to 5 milliampere ammeter 54, 10K ohm resister 44 and two serially connected 0.047 microfared capacitors 46 and 48 to output switches 50 and 52. The output switch 50 can be moved from an open position to connect to either the line output test lead 56 or the neutral output test lead 58. Similarly, the output switch 52 can be moved from its open position to either connect the neutral output test lead 58 or the grounded output test lead 60. The branch circuit conductors 86, 88 and 90 can be respectively connected to the output test lead terminals 62, 64 and 90. Thus, by movement of the switches 50 and 52, the test circuit 12 can be positioned to place the output of the secondary side 40 of the step-up transformer 36 across the line-to-neutral, line-to-ground and neutral-to-ground connections to the branch circuit conductors. Preferably, the line output test lead 56, the neutral output test lead 58 and the ground output test lead 60 are color coded, respectively black, white and green for ease of connection to the correspondingly colored conductors of the branch circuit.

Desirably, the output current of the secondary side 40 of the step-up transformer 36 is current limited to approximately 5 milliamps by the series arrangement of the resister 44 with the capacitors 46 and 48, so that damage is avoided if there is a short in the branch circuit. 250 feet of household romex 2 wire with a ground will have a capacitive current at 500 volts of less than 1 milliampere. If the leakage current between the branch circuit conductors is greater than 3 milliamperes, then an insulation failure exists. Therefore, the meter scale of the ammeter 54 need be only in the range of 0 to approximately 5 milliamps. To perform the test, the branch circuit has to be isolated from the utility side of the load center. Preferably, this is done by removing the corresponding circuit breaker so that any abnormality in the breaker circuit does not influence the test. Removal of the breaker also provides ready access to the branch circuit conductors 86, 88 and 90. To perform the insulation test after the tester is connected to the source 18 through terminals 20, 22 and 24 and to the branch circuit conductors through terminal 62, 64 and 66, the switches 50 and 52 are properly positioned to place the output of the secondary side 40 of the step-up transformer 36 across line 86 and neutral 88 in the first test; line 86 and ground 90 in the second test; and neutral 88 and ground 90 in the third test. All positions should have a current reading less than 1 milliampere. A current reading of greater than 3 milliamperes is indicative of an insulation failure. When all three insulation tests are complete, the mode switch 28 is switched from the insulation test position 30 to terminal 32 to connect the shared/grounded neutral test circuit 14.

The test circuit 14 includes a pulse generator 74 which is connected between the line 20 and neutral 22 inputs of the source 18 by way of the mode switch 28 and on/off switch 16. The pulse generator 74 is in turn connected in parallel with the primary winding 78 of a step-down transformer 76. The secondary winding 80 of the step-down transformer 76 is connected across the ground output lead 60 and the neutral output lead 58 through a normally closed relay contacts 72 and 3 ohm resister 82. The winding ratio of the primary 78 to secondary 80 windings of the step-down transformer 76 is designed such that a substantially lower output voltage is applied across the neutral and ground output test leads 58 and 60 than is applied across the pulse circuit 72 and primary winding 78. For example, with an input voltage of 120 volts, the output of the step-down transformer 76 at its secondary winding 80 would be approximately 3 volts. A fuse link 84 is connected in series with the secondary winding circuit for safety purposes in case a 120 volt is erroneously placed across the neutral and ground conductors 88 and 90. Thus, with the on/off switch 16 in the closed position and the mode switch 28 connected to terminal 32, a 3 volt, line frequency signal is pulsed approximately 1 second on and 1 second off, with a maximum voltage level of approximately 3 volts and current level of 1 ampere is applied across the neutral and ground output test leads 58 and 60. As an added precaution, the activation circuit of relay 72 is connected between the neutral wire 22 and the line 20 side of the test button 34 so when the mode switch 28 is moved to connect with terminal 30, a relay 72 is opened to open circuit the secondary side 80 of the step-down transformer 76.

When the white and green output test leads 58 and 60 are connected to the secondary side of the step-down transformer 76 with the mode switch 28 in a shared/grounded neutral test position, using a clipon portable ammeter connected to the white lead, the operator conducting the test then looks for an ammeter reading showing a corresponding pulsing current indicating a shared/grounded neutral fault. The operator can then move the clipon ammeter take-up coil down the corresponding branch circuit conductor in a direction away from the test circuit until the pulse current is no longer detected. The position at which the pulse current is no longer detected should be adjacent to the shared or grounded neutral fault.

In a new installation, each branch circuit should be tested before a breaker for the tested branch is inserted. Only after a successful test result is achieved should the breaker be inserted. In an old installation, if an arc fault breaker trips, it is recommended that the breaker be removed from the circuit before the test is conducted in that branch circuit. First measure the voltage on the line, neutral and ground conductors with reference to ground. If all voltages are less than 3 volts, then proceed with the testing steps set forth above for new installations. If any of the voltages are more than 3 volts, a circuit to circuit fault is present that has to be corrected before the test can proceed. The foregoing voltage measurement for old installations can be made using a simple Voltmeter Type 72-6173, manufactured by TENMA.

While specific embodiments of the invention have been described in detail, it will be appreciated by those skilled in the art that various modifications and alternatives to those details could be developed in light of the overall teachings of the disclosure. For example, while specific circuit values for a number of the components have been identified, other combination of values may be employed without departing from the scope of the overall teachings of this specification. Accordingly, the particular arrangements disclosed are meant to be illustrative only and not limiting as to the scope of the invention which is to be given the full breadth of the appended claims and any and all equivalents thereof.

What is claimed is:

1. A tester for verifying the integrity of wiring insulation in an electrical circuit comprising:

an alternating current voltage source having a first and second output terminal leads;

a line lead wire connectable to a line conductor in said electrical circuit;

a neutral lead wire connectable to a neutral conductor in said electrical circuit;

a ground lead wire connectable to a ground conductor in said electrical circuit;

a first switch connected to one of either the first or second voltage source output terminal leads and switchable between either said line lead wire or said neutral lead wire;

a second switch connected to the other of either the first or second voltage source output terminal loads and switchable between either said neutral lead wire or said ground lead wire;

an ammeter connected in series with and between said voltage source and either said first or second switch;

wherein the alternating current voltage source is a step up transformer and wherein a first tester circuit comprises a secondary winding of the step up transformer, the ammeter and the first and second switches and said tester further includes a second tester circuit comprising a pulse generator, a primary winding of a step down transformer connected to the pulse generator and a secondary winding of the step down transformer connected between the neutral lead wire and the ground lead wire.

2. The tester of claim 1 wherein the secondary winding of the step down transformer is current limited.

3. The tester of claim 2 wherein the secondary winding of the step down transformer is current limited to approximately 1 A.

4. The tester of claim 1 wherein the step down transformer steps down a house voltage to approximately 3 volts.

5. The tester of claim 1 including means for disabling the second tester circuit when the first tester circuit is energized.

6. The tester of claim 5 wherein the means for disabling the second tester circuit comprises a normally closed relay switch in series with the secondary winding of the step down transformer.

7. The tester of claim 6 wherein an activation circuit of the relay is connected in parallel with a primary winding of the step up transformer so that the relay opens when the first tester circuit is energized.

8. A method of verifying the integrity of wiring insulation in an electrical circuit disconnected from a load, wherein the wiring includes at least line and neutral electrical conductors, comprising the steps of:

isolating the electrical circuit from a main power supply;

placing a preselected voltage across the line and neutral electrical conductors of the wiring, which is substantially larger than a voltage rating of the main power supply, but below a voltage rating of the wiring;

monitoring the leakage current flowing through the wiring to identify a predetermine leakage current indicative of failure of tho wiring insulation;

wherein the wiring includes a ground electrical conductor and the placing step sequentially places the preselected voltage across the line and neutral electrical conductors of the wiring, across the line and ground electrical conductors of the wiring and across the neutral and ground electrical conductors of the wiring;

wherein if the predetermined leakage current is detected, including the steps of:

removing the preselected voltage from across the line and neutral electrical conductors of the wiring, from across the line and ground electrical conductors of the wiring and from across the neutral and ground electrical conductors of the wiring;

placing a pulsed current source having a voltage substantially less than the voltage of the main power supply across the neutral and ground conductors of the wiring;

checking with an ammeter for a pulse current along the neutral or ground electrical conductor of the wiring, and if a pulsed current is detected along the ground or neutral electrical conductor of the wiring within the vicinity of the pulsed current source; and moving the ammeter along the neutral or ground electrical conductor in a direction away from the pulsed current source until the pulsed current is no longer detected to identify the location of a shared/grounded neutral.

9. The method of claim 8 including the step of limiting the pulsed current to approximately 1 A.

* * * * *